United States Patent
Hussain et al.

(10) Patent No.: US 6,884,704 B2
(45) Date of Patent: Apr. 26, 2005

(54) OHMIC METAL CONTACT AND CHANNEL PROTECTION IN GAN DEVICES USING AN ENCAPSULATION LAYER

(75) Inventors: Tahir Hussain, Calabasas, CA (US); Miroslav Micovic, Newbury Park, CA (US); Paul Hashimoto, Los Angeles, CA (US); Gary Peng, San Gabriel, CA (US); Ara K. Kurdoghlian, La Canada Flintridge, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/634,348

(22) Filed: Aug. 4, 2003

(65) Prior Publication Data

US 2004/0029330 A1 Feb. 12, 2004

Related U.S. Application Data

(60) Provisional application No. 60/401,414, filed on Aug. 5, 2002.

(51) Int. Cl.[7] .......................... H01L 21/48; H01L 21/38
(52) U.S. Cl. .................. 438/572; 438/46; 438/285; 438/571
(58) Field of Search ........................ 438/46, 285, 572

(56) References Cited

U.S. PATENT DOCUMENTS

| | | | |
|---|---|---|---|
| 5,760,418 A | 6/1998 | Lee et al. | 257/20 |
| 5,766,695 A | 6/1998 | Nguyen et al. | 427/553 |
| 6,100,548 A | 8/2000 | Nguyen et al. | 257/192 |
| 6,391,696 B1 | 5/2002 | Onda | 438/167 |
| 2001/0013604 A1 | 8/2001 | Hase | 257/12 |
| 2004/0021152 A1 * | 2/2004 | Nguyen et al. | 257/192 |

FOREIGN PATENT DOCUMENTS

| | | |
|---|---|---|
| EP | 0 899 782 A2 | 3/1999 |
| WO | WO 01/13436 A1 | 2/2001 |
| WO | WO 01/57929 A1 | 8/2001 |

OTHER PUBLICATIONS

U.S. Appl. No. 10/600,521, Nguyen et al., filed Jun. 19, 2003.

* cited by examiner

*Primary Examiner*—Long Pham
(74) *Attorney, Agent, or Firm*—Ladas & Parry LLP

(57) ABSTRACT

A method for fabricating a semiconductor device which protects the ohmic metal contacts and the channel of the device during subsequent high temperature processing steps is explained. An encapsulation layer is used to cover the channel and ohmic metal contacts. The present invention provides a substrate on which a plurality of semiconductor layers are deposited. The semiconductor layers act as the channel of the device. The semiconductor layers are covered with an encapsulation layer. A portion of the encapsulation layer and the plurality of semiconductor layers are removed, wherein ohmic metal contacts are deposited. The ohmic metal contacts are then annealed to help reduce their resistance. The encapsulation layer ensures that the ohmic metal contacts do not migrate during the annealing step and that the channel is not harmed by the high temperatures needed during the annealing step.

24 Claims, 8 Drawing Sheets

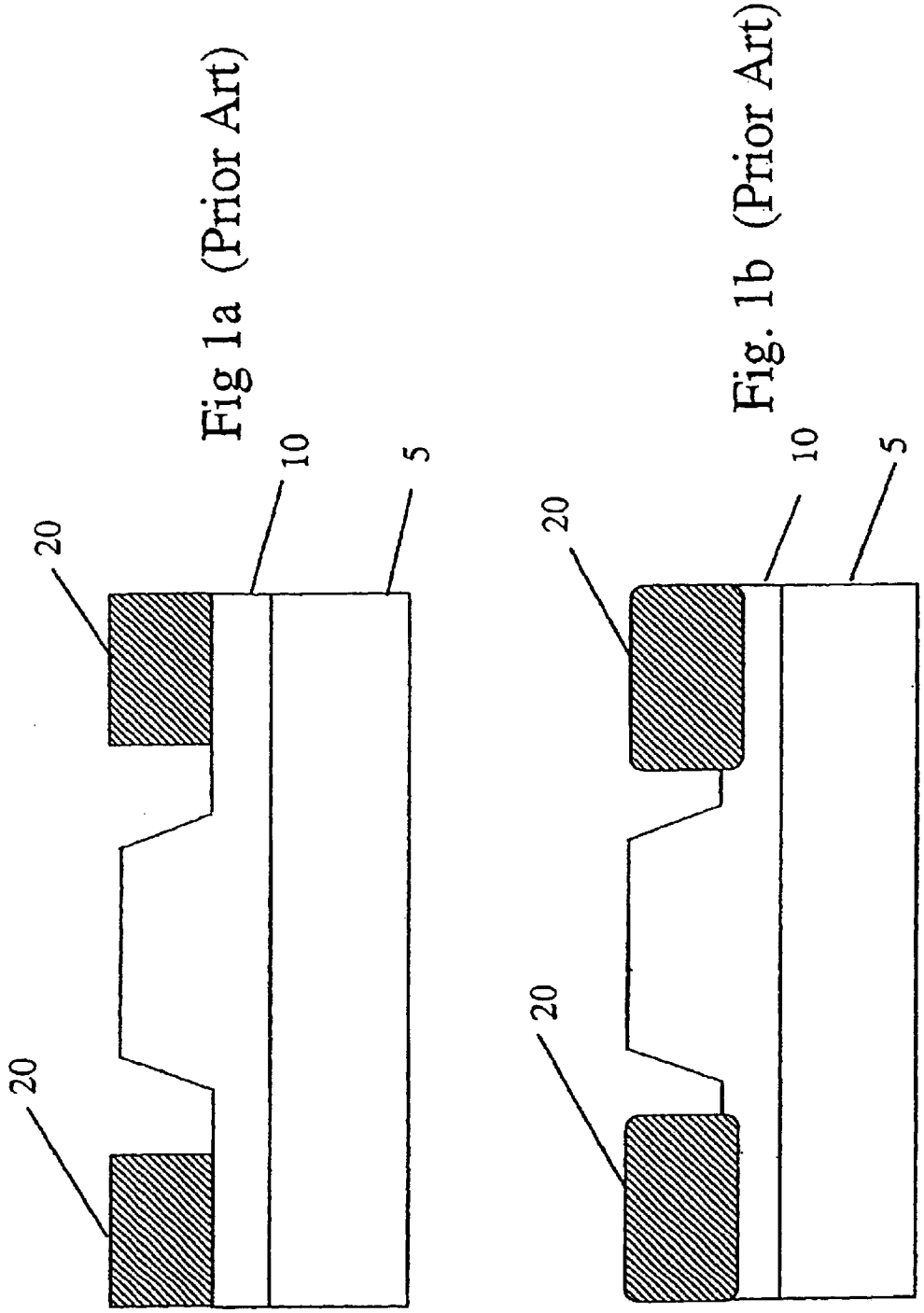

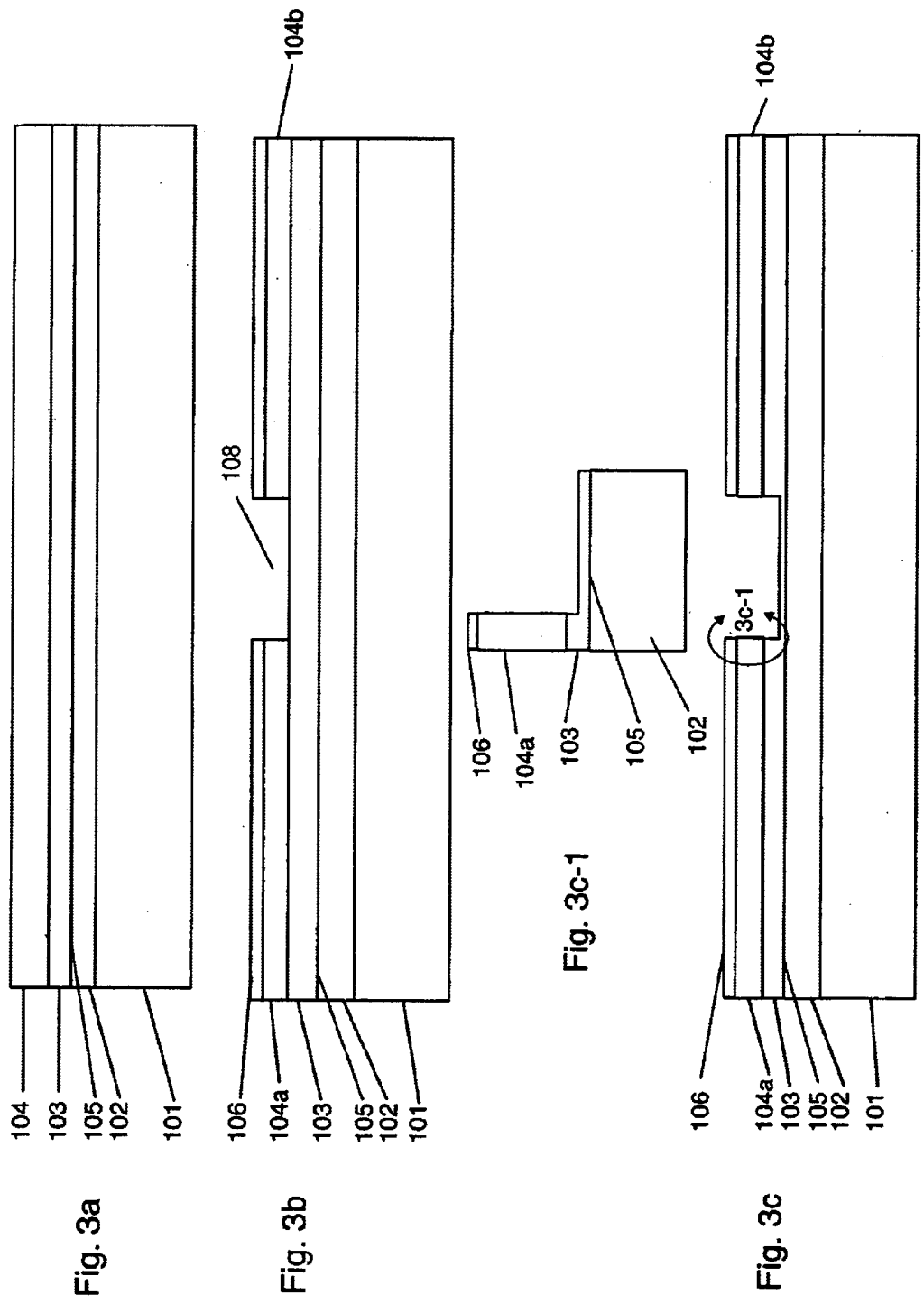

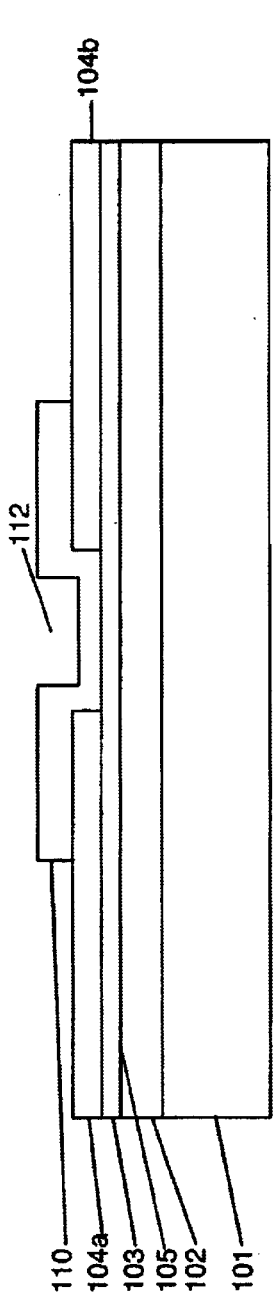
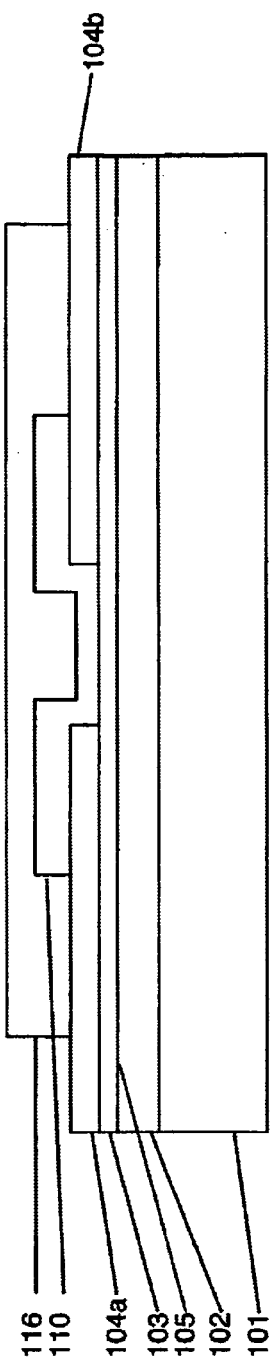
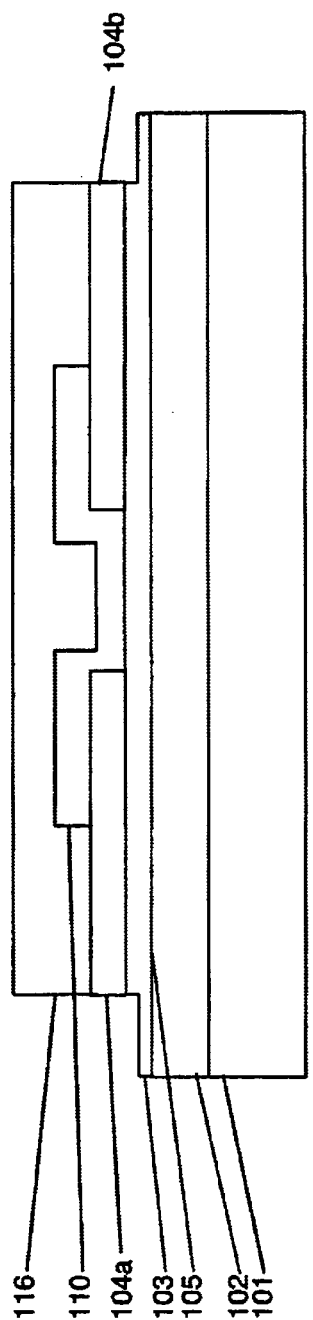

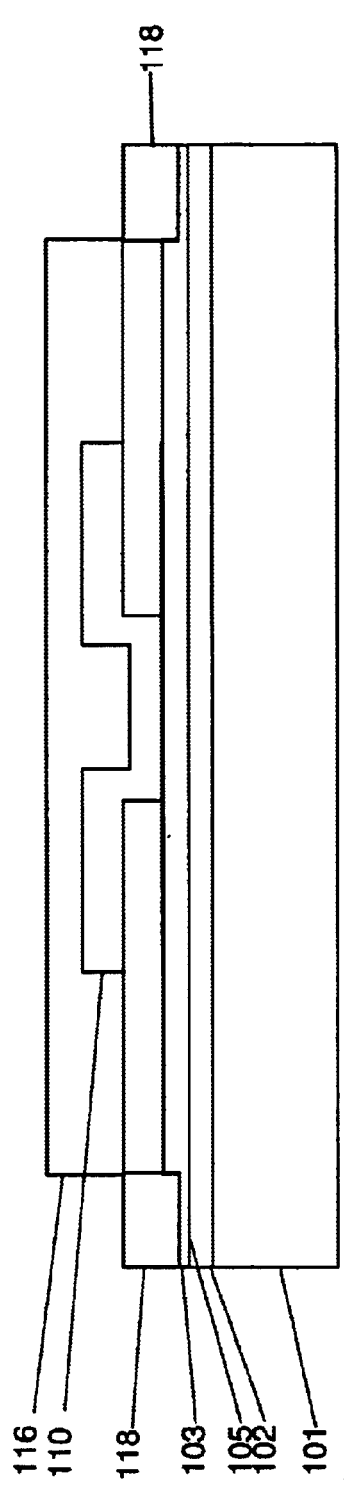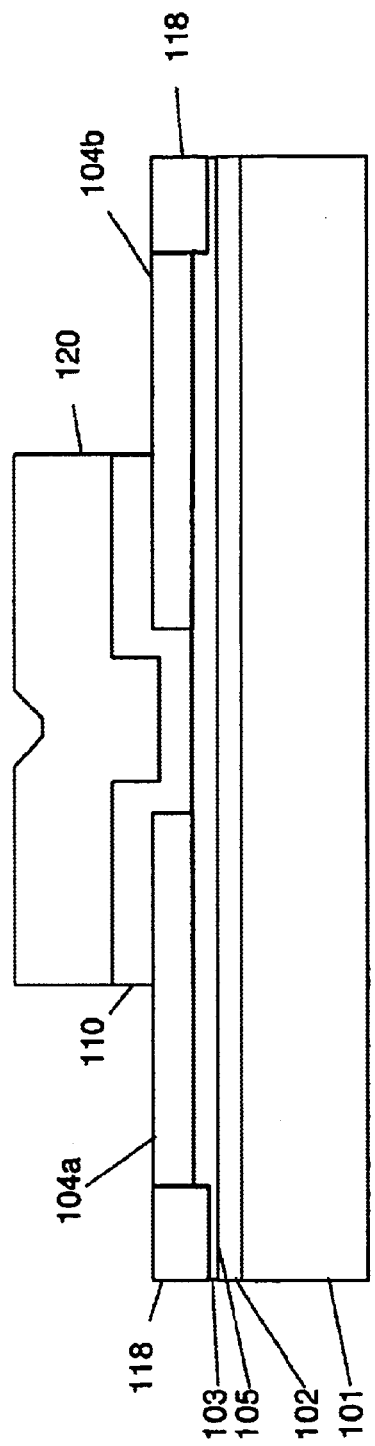
Fig. 3j
Fig. 3k

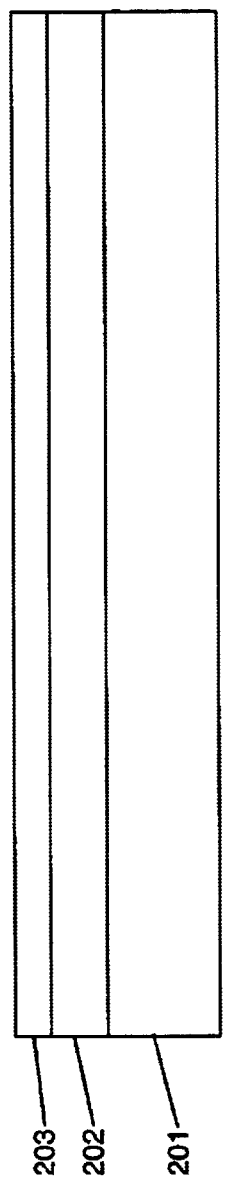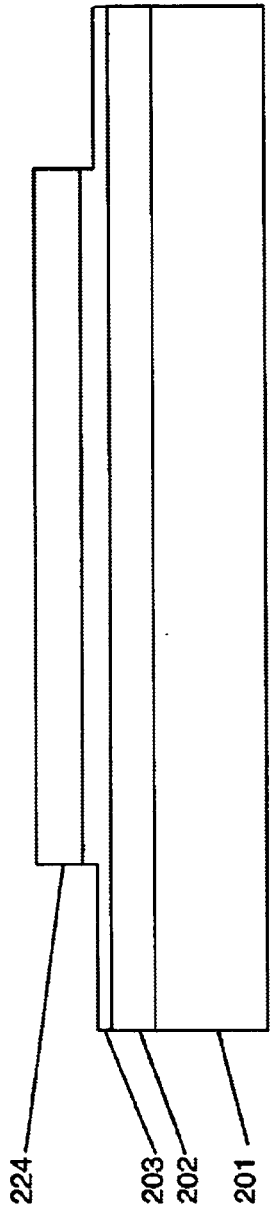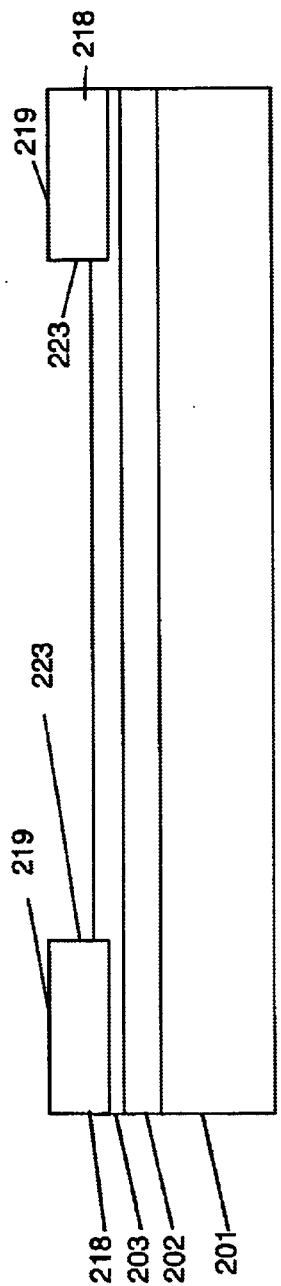

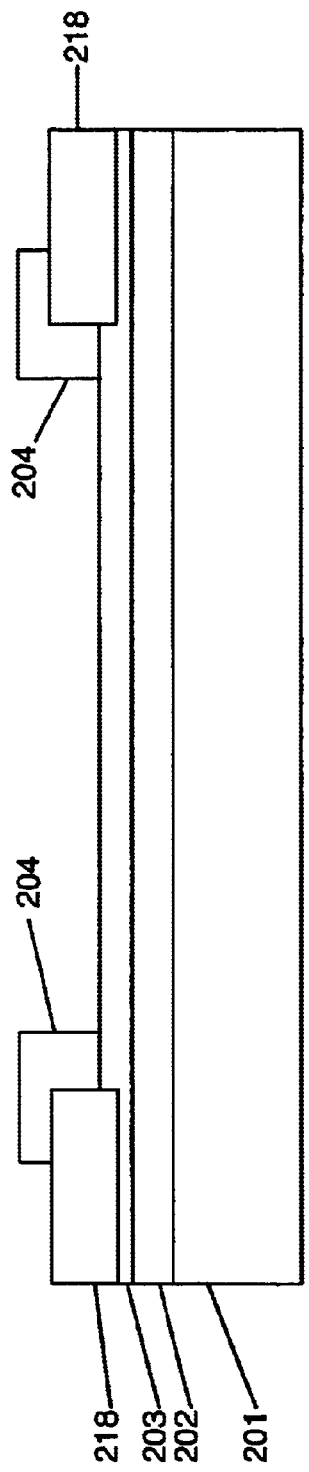

OHMIC METAL CONTACT AND CHANNEL PROTECTION IN GAN DEVICES USING AN ENCAPSULATION LAYER

CROSS REFERENCE TO RELATED APPLICATIONS

The present document claims the benefit of U.S. Provisional Application No. 60/401,414, filed Aug. 5, 2002, the contents of which are incorporated by reference herein.

The present document is also related to the co-pending and commonly assigned patent application documents entitled "A Process for Fabricating Ultra-Low Contact Resistances In GaN Based Devices," U.S. Ser. No. 60/401,415, and "GaN/AlGaN Heterostructure Field Effect Transistor with Dielectric Recessed Gate," U.S. Ser. No. 10/214,422 which were filed on even date. The contents of these related applications are hereby incorporated by reference herein.

FIELD

The present invention relates to a new method for protecting a semiconductor device. More specifically, the present invention relates to a method for protecting the ohmic metal contacts and the channel of a device when the device is exposed to the high temperatures needed for alloying the ohmic metal contacts.

BACKGROUND

Semiconductor device fabrication that involves alloying ohmic metal contacts is a technique used for fabricating devices with low contact resistance in the ohmic metal contacts. However, temperatures in excess of 800° C. are typically necessary for alloying ohmic metal contacts for Group III-nitride material devices. However, exposure to such high temperatures creates problems within the channel of the device as well as with the ohmic metal contacts themselves.

Fabrication of low noise devices requires a narrow separation of the source and drain of the transistor. In gallium-nitride (GaN) technology and Group III-nitride technology, achieving a narrow separation between the source and drain becomes difficult due to the high temperature processing step of alloying the source and drain ohmic metal contacts. In general, the ohmic metal contacts have smooth edges, but when exposed to high temperatures, the edges become jagged. In addition, the high temperatures cause the edges of the ohmic metal contacts to move in an uncontrollable manner. These problems place a lower limit on the design of the source-drain separation.

Previously, attempts have been made at fabricating low resistance ohmic metal contacts. In one process, a substrate 5 is provided and a semiconductor layer 10 is deposited on the substrate 5. Next, the source-drain regions are etched in the semiconductor layer 10 using chlorine plasma in a reactive ion etching system. The ohmic metal contacts 20 for the source and drain contact pads, as shown in FIG. 1a, are then deposited on the semiconductor layer 10. The source-drain separation in this procedure is generally about 2 $\mu$m. Then, the ohmic metal contacts 20 are annealed for 30 seconds at 875° C. in a nitrogen ambient. This technique helps reduce the resistance of the ohmic metal contacts 20. However, the process does not provide a method for protecting the structure of the ohmic metal contacts 20 from the high temperatures during the annealing process. After the ohmic metal contacts 20 are exposed to the high temperatures, as shown in FIG. 1b, the edges become jagged and the ohmic metal contacts 20 begin to migrate and creep towards one another in an uncontrollable manner. The problem with ohmic metal migration is that it places a lower limit on the design of the device. Typically, the ohmic metal contacts are deposited on the source and drain of a semiconductor device with a desired distance of about 1 micrometer between the source and drain. However, the source and drain may need to be moved further apart to account for the unpredictable migration of the ohmic metal contacts. As a result, it is not always possible to obtain a 1 micrometer separation between the source and drain.

Another problem associated with the high temperatures needed for alloying ohmic metal contacts is that the electron mobility in the channel of transistors is severely reduced when the channel is exposed to high temperatures. Although the physical phenomenon causing the reduction in mobility is unknown, the problem has been experimentally determined. This problem ultimately slows down the speed of the device. In "GaN/AlGaN Heterostructure Field Effect Transistor with Dielectric Recessed Gate," U.S. Ser. No. 10/214,422 a method for forming a gate recessed into a silicon-nitride (SiN) film is taught. The purpose of this technique is to lower the parasitic resistance of the gate. Using this technique, a substrate 40 is provided and a buffer layer 50 is deposited on the substrate 40. Then, a first and second semiconductor layer 60, 70 are deposited. The first and second semiconductor layers will serve as the channel of the device. The first semiconductor layer 60 is typically GaN, and the second semiconductor layer is typically AlGaN. Finally, a dielectric layer 80, typically SiN, is deposited on the second semiconductor layer 70. A portion of the dielectric layer 80 and second semiconductor layer 70 is removed. Next, ohmic metal contacts 90, as shown in FIG. 2a, are deposited and alloyed at about 875° C. After alloying, the dielectric layer 80 is recessed and a gate 95 is deposited as shown in FIG. 2b. As can be seen in FIGS. 2a and 2b, the ohmic metal contacts for the source and drain are still partly exposed. During subsequent high temperature processing the ohmic metal contacts 90 may creep towards each other. Furthermore, patterning a SiN dielectric layer 80 for gate 95 deposition is extremely difficult and unpractical after the SiN dielectric layer 80 has been exposed to the high alloying temperatures. The technique used to pattern the SiN dielectric layer 80 is likely to cause damage to the second semiconductor layer 70 underneath the gate 95, thereby degrading the performance characteristics of the channel in the semiconductor device.

Therefore, there is a need for a method of fabricating a semiconductor device that can protect the ohmic metal contacts from high temperatures, resulting in the migration of the ohmic metal contacts. There is also a need for a method of fabricating a semiconductor device that can protect the channel and maintain the performance characteristics of the channel in the semiconductor device when the device is exposed to high temperatures.

SUMMARY

Accordingly, one aspect of the present invention provides a method and apparatus for fabricating a semiconductor device that prevents ohmic metal in the ohmic metal contacts from migrating and protects the channel when the ohmic metal contacts are alloyed. A substrate is provided whereon a plurality of layers of semiconductor material are deposited. The plurality of layers create a channel in the semiconductor device. An encapsulation layer is deposited on the plurality of layers. The encapsulation layer is used to protect the channel when the ohmic metal contacts are alloyed. Additionally, the encapsulation layer prevents the ohmic metal in the ohmic metal contacts from migrating during high temperature processing. After depositing the encapsulation layer, a portion of the encapsulation layer is removed to create an opening, wherein a gate metal is deposited. The encapsulation layer is further patterned and a portion of the encapsulation layer and plurality of layers are removed to create an opening wherein the ohmic metal contacts are deposited. As aforementioned, the encapsulation layer will protect the ohmic metal contacts by preventing movement when they are alloyed.

Another aspect of the present invention provides a method and apparatus for fabricating a semiconductor device which prevents ohmic metal in the ohmic metal contacts from migrating when protecting the channel is not of concern. A substrate is provided, using this method and apparatus, whereon a plurality of layers of semiconductor material are provided. A portion of the plurality of layers is removed to create openings wherein the ohmic metal contacts are deposited. An encapsulation layer is subsequently deposited on a portion of the ohmic metal contacts. The encapsulation layer will prevent the movement of the ohmic metal contacts when the ohmic metal contacts are alloyed.

BRIEF DESCRIPTION OF DRAWINGS

FIG. 1a depicts a prior art device with deposited ohmic metal contacts.

FIG. 1b depicts the prior art device shown in FIG. 1a after exposure to the high temperature.

FIG. 2a depicts a step in a prior art method for forming a GaN device.

FIG. 2b depicts a further processing step for the device shown in FIG. 2a.

FIG. 3a shows a substrate with the plurality of layers and the encapsulation layer.

FIG. 3b shows a substrate with the plurality of layers and the patterned encapsulation layer.

FIGS. 3c and 3c–1 show a further optional step of 3b.

FIG. 3g shows a portion of the refractory metal layer patterned and removed.

FIG. 3h shows a photoresist layer deposited on the refractory metal layer.

FIG. 3i shows a portion of the encapsulation layer and plurality of layers removed.

FIG. 3j shows the deposition of the ohmic metal contacts.

FIG. 3k shows the deposition of the gate metal layer.

FIG. 4a shows a substrate with the plurality of layers of semiconductor material FIG. 4b shows the photoresist on the second layer, and a portion of the second layer removed.

FIG. 4c shows the deposition of the ohmic metal contacts.

FIG. 4d shows the encapsulation layer deposited on the ohmic metal contacts.

DETAILED DESCRIPTION OF PREFERRED EMBODIMENTS

The present invention will now be described more fully hereinafter with reference to the accompanying drawings, in which preferred embodiments of the invention are shown. This invention may be embodied in many different forms and should not be construed as limited to the embodiments set forth herein.

First Embodiment

Figures 2A, 2B:
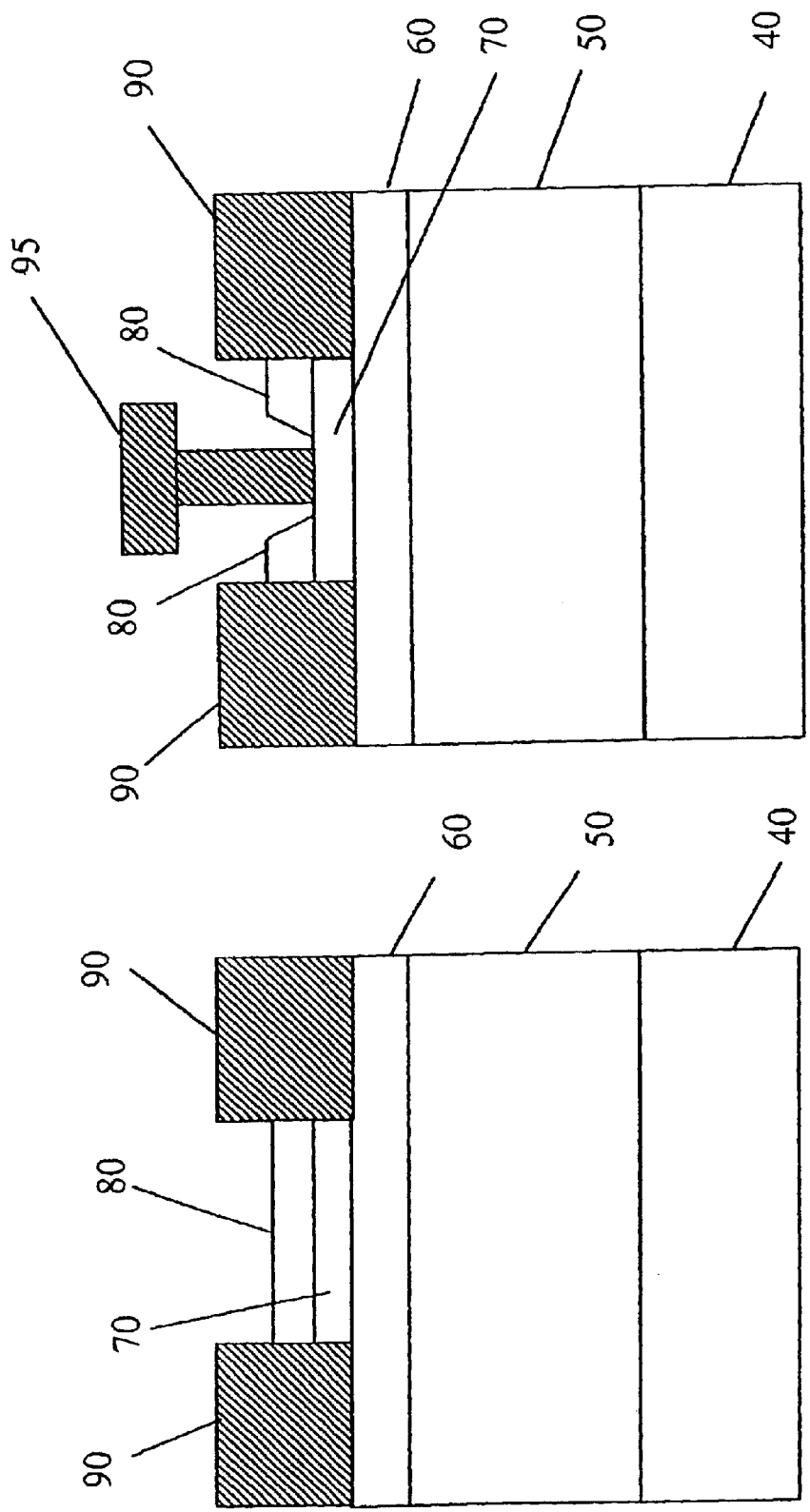
Figure 3D:
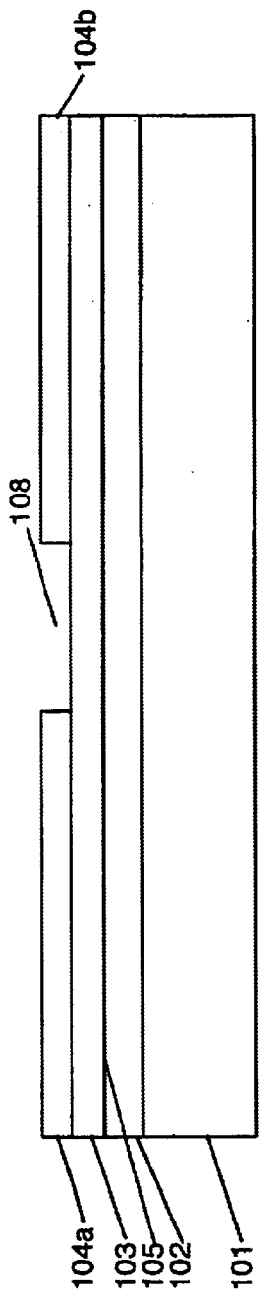
FIG. 3d shows FIG. 3b with the photoresist layer removed.

A method and apparatus for protecting the ohmic metal contacts and channel of a semiconductor device according to a first embodiment of the present invention is described with reference to FIGS. 3a–3k. Referring to FIG. 3a, a substrate 101, preferably comprised of silicon carbide (SiC), is provided. Next, a first layer 102, preferably comprised of GaN and preferably fabricated using molecular beam epitaxy, is deposited on the substrate 101. A second layer 103, preferably comprised of AlGaN and fabricated using molecular beam epitaxy, is deposited on the second layer 102. An interface 105 is created between the first layer 102 and the second layer 103. The interface 105 serves as the channel of the semiconductor device. An encapsulation layer 104, preferably comprised of SiN, is deposited on the surface of the second layer 103. The encapsulation layer 104 has a thickness typically in the range of 50–200 nanometers, but is preferably 100 nanometers thick.

Next, as shown in FIGS. 3b–3c, 3c–1, and 3d, a first opening 108 for a gate structure is formed. First, a first layer of photoresist 106, preferably electron-sensitive photoresist, is deposited on the exposed SiN layer 104 as shown in FIG. 3b. Electron beam lithography is used to pattern and remove at least a portion of the electron-sensitive photoresist layer 106 and the encapsulation layer 104, thereby creating the first opening 108, as shown in FIG. 3b, which exposes the surface of the second layer 103. Optionally, as shown in FIG. 3c and in even greater detail in FIG. 3c–1, a portion of the second layer 103 may also be removed using reactive ion etching. The removal of a portion of the encapsulation layer 104, leaves two separate encapsulation layers 104a, 104b. The first opening 108 exposes a portion of the second layer 103 and is created by the separation of the encapsulation layers 104a, 104b. After the first opening 108 is created, the remaining portion of the electron-sensitive photoresist layer 106 is removed, as shown in FIG. 3d, using techniques known in the art.

Figure 3E:
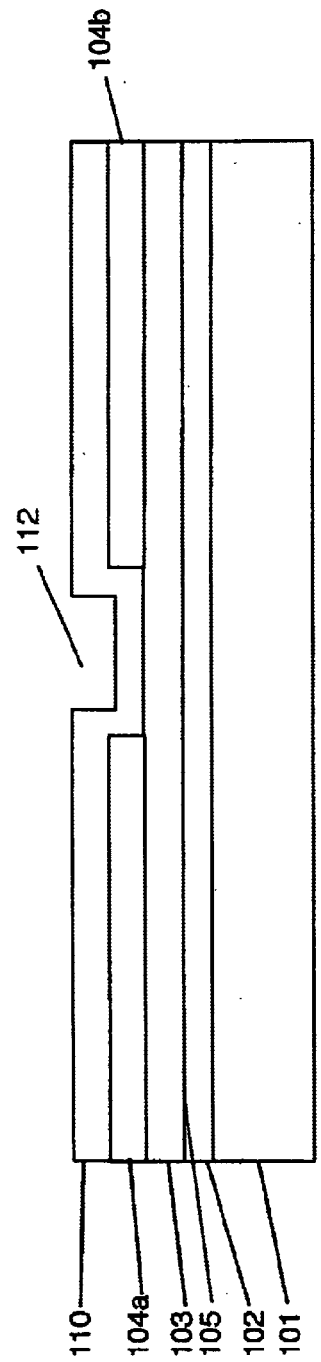
FIG. 3e shows the refractory metal layer deposited in the opening.

Next, as shown in FIG. 3e, a refractory metal layer 110, preferably comprised of molybdenum (Mo), tungsten (W), or tungsten silicide, is deposited on the surface of the remaining encapsulation layers 104a, 104b and in the first opening 108. The refractory metal layer 110 typically has a thickness in the range of 100–400 nanometers, but is preferably 100 nanometers thick. Optionally, a thin layer of platinum (Pt) or titanium (Ti) (not shown) may be applied over the refractory metal layer 110 to help promote the adhesion of a gold layer, which is discussed later.

The refractory metal layer 110, which is deposited in the first opening 108 makes direct contact with the surface of the second layer 103. The portion of the refractory metal layer 110 deposited on the encapsulation layers 104a, 104b extends partially over the edge of the encapsulation layers 104a, 104b to make contact with the refractory metal layer 110 deposited in the first opening 108. The partial extension over the edge creates a second opening 112 directly above the portion of the refractory metal contacting the second layer 103. This refractory metal layer 110 will eventually become the gate of the device.

Figure 3F:
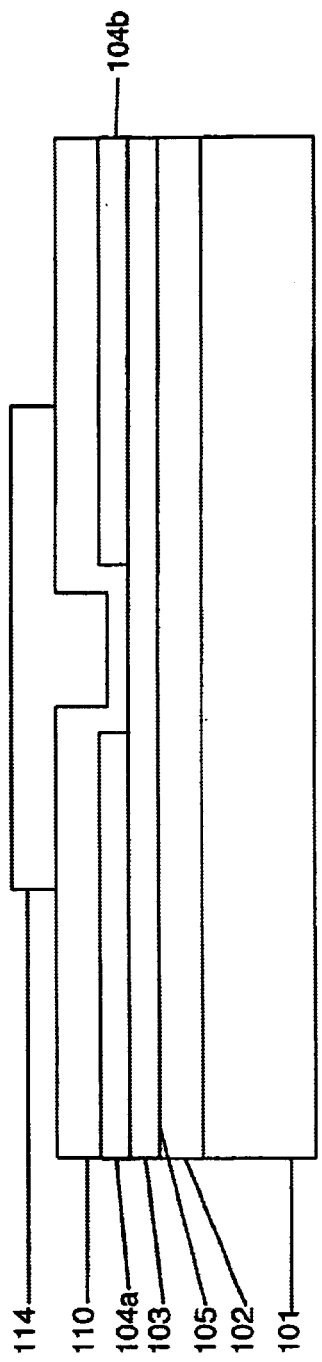
FIG. 3f shows a photoresist layer deposited on the refractory metal layer.

As shown in FIG. 3f, a second layer of photoresist 114, preferably for optical photolithography, is deposited on a portion of the refractory metal layer 110 and in the second opening 112. The portion of the refractory metal layer 110 not covered by the photolithography photoresist 114 is removed, as shown in FIG. 3g, using techniques known in the art, such as a $CF_4$ dry etch. After the desired portion of the refractory metal layer 110 has been removed, the optical photolithography photoresist 114 is removed using techniques known in the art.

The next step is the formation of ohmic metal contacts 118 for the device (shown in FIGS. 3j and 3k). As shown in FIG. 3h, a third layer of photoresist 116, preferably for photolithography, is deposited to cover all the exposed refractory metal layer 110 and a portion of the encapsulation layers 104a, 104b. The area of encapsulation layers 104a, 104b, that remain exposed will be removed to create regions where the ohmic metal contacts 118 will be deposited. In this embodiment, the spacing between the ohmic metal contacts 118 is as low as 1 micrometer apart. Techniques known in the art, such as reactive ion etching using $CF_4$ or Cl gas, are used to etch away the exposed portion of the encapsulation layers 104a, 104b, as well as a portion of the second layer 103 as shown in FIG. 3i.

Ohmic metal contacts 118, preferably comprising a combination of titanium (Ti), aluminum (Al), nickel (Ni), and gold (Au), are deposited on the second layer 103, as shown in FIG. 3j in the regions where a portion of the encapsulation layer 104a, 104b, and second layer 103 were removed. Next, the third layer of photoresist 116 is removed using techniques known in the art. If any ohmic metal was deposited on the third layer of photoresist 116 during deposition of the ohmic metal contacts 118, that ohmic metal will be removed when the third layer of photoresist 116 is removed. After the ohmic metal contacts 118 are deposited, the device is heated to temperatures in excess of 800° C., in order to alloy the ohmic metal contacts 118. The encapsulation layers 104a, 104b form a dam to prevent the flow or migration of ohmic metal during the high temperature alloying process. Furthermore, the remaining encapsulation layers 104a, 104b protects the interface 105 against a reduction in electron mobility during the alloying.

After alloying the ohmic metal contacts 118, a gate contact 120, preferably comprising gold, is deposited on the remaining refractory metal layer 110 and in the second opening 112, as shown in FIG. 3k. The gate contact 120 helps to reduce the resistance of the gate of the transistor.

Second Embodiment

A method and apparatus for protecting the ohmic metal contacts of a semiconductor device according to a second embodiment will now be described and is shown in FIGS. 4a–4d. In this second embodiment, a substrate 201, preferably comprising silicon-carbide (SiC), is provided. The first layer 202, preferably comprising GaN, and the second layer 203, preferably comprising AlGaN, are deposited on the substrate 201 as shown in FIG. 4a. Next, a layer of photoresist 224, preferably for optical lithography, is deposited on the second layer 203. The photoresist layer 224 is patterned and a portion of the second layer 203 is removed as shown in FIG. 4b, using techniques known in the art such as RIE with $CF_4$ or $Cl_2$ gas.

Next, ohmic metal contacts 218 are deposited on the first layer 202, as shown in FIG. 4c. The ohmic metal contacts 218 have first surfaces 219 and first edges 223. After the ohmic metal contacts 218 are deposited, an encapsulation layer 204, preferably comprising SiN, is deposited on a portion of the first surfaces 219 of the ohmic metal contacts 218 in a manner as to cover the first edges 223 of the ohmic metal contacts, as shown in FIG. 4d. The SiN layer 204 may be in the range of 50–200 nanometers, but is preferably about 100 nanometers thick. It is preferable to deposit the least amount of the SiN layer 204 on the first surfaces 219 of the ohmic metal contacts 218, as shown in FIG. 4d. The ohmic metal contacts 218 are preferably comprised of a combination of titanium (Ti), aluminum (Al), nickel (Ni), and gold (Au). After the ohmic metal contacts 218 have been deposited, the ohmic metal contacts 218 are alloyed at preferably 850° C. for approximately 30 seconds to reduce their resistance.

The encapsulation layer on the first edges 223 of the ohmic metal contacts 218 will help prevent the first edges 223 of the ohmic metal contacts 118 from becoming rough or moving while exposed to the high temperatures needed to alloy the ohmic metal contacts 218.

Let it be understood that the foregoing description is only illustrative of the invention. Various alternatives and modifications can be devised by those skilled in the art without departing from the spirit of the invention. Accordingly, the present invention is intended to embrace all such alternatives, modifications, and variances which fall within the scope of the appended claims.

What is claimed is:

1. A method for fabricating and protecting a semiconductor device comprising the steps of:
   providing a substrate;
   depositing a plurality of semiconductor layers on the substrate, the plurality of semiconductor layers having an interface serving as a channel;
   depositing an encapsulation layer having a first surface on at least one layer of the plurality of layers;
   depositing ohmic metal contacts on the plurality of layers; and
   alloying the ohmic metal contacts, wherein the encapsulation layer protects the channel and prevents ohmic metal in the ohmic metal contacts from migrating during the step of alloying.

2. The method of claim 1, wherein the substrate comprises SiC.

3. The method of claim 1, wherein the encapsulation layer comprises SiN.

4. The method of claim 1, wherein the plurality of layers comprise a first layer, the first layer comprising GaN.

5. The method of claim 4, wherein the plurality of layers further comprises a second layer deposited over the first layer, the second layer comprising AlGaN.

6. The method of claim 1, wherein the encapsulation layer has a thickness in the range of 50–200 nanometers.

7. The method of claim 5, wherein the step of depositing ohmic metal contacts comprises the steps of:
   removing a portion of the encapsulation layer and the second layer; and
   depositing the ohmic metal contacts where the portion of the encapsulation layer and the second layer is removed.

8. The method of claim 1, further comprising the step of removing a portion of the encapsulation layer, thereby creating an opening.

9. The method of claim 8, further comprising the step of depositing a refractory metal layer in the opening and on a portion of the first surface of the encapsulation layer.

10. The method of claim 9, wherein the refractory metal layer comprises a metal selected from the group consisting of molybdenum, tungsten, and tungsten-silicide.

11. The method of claim 9, wherein the refractory metal layer has a thickness in the range of 100–400 nanometers.

12. The method of claim 11, wherein the refractory metal layer has a thickness of 100 nanometers.

13. The method of claim 9, further comprising the step of depositing a gate contact on the refractory metal layer.

14. The method of claim 1, wherein the ohmic metal contacts comprise a combination of titanium, aluminum, nickel, and gold.

15. The method of claim 1, wherein the step of alloying further comprises the step of exposing the ohmic metal contacts to a temperature of at least 800° C. for at least 30 seconds.

16. A method for fabricating and protecting a semiconductor device comprising the steps of:

provding a substrate;

depositing at least one semiconductor layer on the substrate;

depositing ohmic metal contacts on the at least one semiconductor layer, the ohmic metal contacts having a first surface and a first edge;

depositing an encapsulation layer on at least a portion of the first surface and the first edge of the ohmic metal contacts; and alloying the ohmic metal contacts, wherein the encapsulation layer prevents migration of ohmic metal in the ohmic metal contacts during the step of alloying.

17. The method of claim 16, wherein the substrate comprises SiC.

18. The method of claim 16, wherein the encapsulation layer comprises SiN.

19. The method of claim 16, wherein the at least one semiconductor layer comprises a first layer, the first layer comprising GaN.

20. The method of claim 19, wherein the at least one semiconductor layer further comprises a second layer deposited over the first layer, the second layer comprising AlGaN.

21. The method of claim 16, wherein the encapsulation layer has a thickness in the range of 50–200 nanometers.

22. The method of claim 20, wherein the step of depositing ohmic metal contacts, further comprises the steps of:

removing a portion of the second layer; and depositing the ohmic metal contacts where the portion of the second layer is removed.

23. The method of claim 16, wherein the ohmic metal contacts comprise a combination of titanium, aluminum, nickel, and gold.

24. The method of claim 16, wherein the step of alloying comprises the step of exposing the ohmic metal contacts to a temperature in excess of 800° C. for at least 30 seconds.

* * * * *